(12) United States Patent
Weber et al.

(10) Patent No.: US 7,193,293 B2
(45) Date of Patent: Mar. 20, 2007

(54) SEMICONDUCTOR COMPONENT WITH A COMPENSATION LAYER, A DEPLETION ZONE, AND A COMPLEMENTARY DEPLETION ZONE, CIRCUIT CONFIGURATION WITH THE SEMICONDUCTOR COMPONENT, AND METHOD OF DOPING THE COMPENSATION LAYER OF THE SEMICONDUCTOR COMPONENT

(75) Inventors: Hans Weber, Ainring (DE); Dirk Ahlers, München (DE); Gerald Deboy, München (DE)

(73) Assignee: Infineon Technologies AG, München (DE)

( * ) Notice: Subject to any disclaimer, the term of this patent is extended or adjusted under 35 U.S.C. 154(b) by 876 days.

(21) Appl. No.: 10/141,834

(22) Filed: May 9, 2002

(65) Prior Publication Data

US 2002/0167082 A1 Nov. 14, 2002

(30) Foreign Application Priority Data

May 9, 2001 (DE) ................. 101 22 364

(51) Int. Cl.
*H01L 29/00* (2006.01)
(52) U.S. Cl. .................... 257/547; 257/329
(58) Field of Classification Search .............. 257/329, 257/493, 547
See application file for complete search history.

(56) References Cited

U.S. PATENT DOCUMENTS 5,216,275 A * 6/1993 Chen ................. 257/493
5,754,310 A    5/1998 Aoki et al.
6,184,555 B1 * 2/2001 Tihanyi et al. ............ 257/342
2002/0123188 A1 * 9/2002 Deboy et al. ............ 438/212

FOREIGN PATENT DOCUMENTS

| DE | 43 09 764 C2 | 9/1994 |
| DE | 198 40 032 C1 | 11/1999 |
| DE | 100 41 344 A1 | 3/2001 |
| DE | 199 42 677 A1 | 3/2001 |
| WO | WO 200118870 A2 * | 3/2001 |

OTHER PUBLICATIONS

Published International Application No. 97/29518 (Tihanyi et al.), dated Aug. 14, 1997.

* cited by examiner

*Primary Examiner*—Thomas L. Dickey
(74) *Attorney, Agent, or Firm*—Laurence A Greenberg; Werner H. Stemer; Ralph E. Locher

(57) ABSTRACT

A semiconductor component, which functions according to the principle of charge carrier compensation, has incompletely ionized dopants that are additionally provided in a semiconductor body of the semiconductor component. When a reverse voltage is applied, the degree of compensation changes as a function of time and the breakdown voltage of the semiconductor component increases in a manner governed by the degree of compensation. The invention furthermore relates to a circuit configuration and to a method for doping a compensation layer according to the invention.

44 Claims, 12 Drawing Sheets

SEMICONDUCTOR COMPONENT WITH A COMPENSATION LAYER, A DEPLETION ZONE, AND A COMPLEMENTARY DEPLETION ZONE, CIRCUIT CONFIGURATION WITH THE SEMICONDUCTOR COMPONENT, AND METHOD OF DOPING THE COMPENSATION LAYER OF THE SEMICONDUCTOR COMPONENT

BACKGROUND OF THE INVENTION

Field of the Invention

The invention relates to a semiconductor component functioning according to the principle of charge carrier compensation, to a circuit configuration, and to two methods for fabricating a compensation layer of such a compensation component.

Such compensation components are based on the principle that when a reverse voltage is applied, the free charge carriers of the n- and p-doped regions within the drift region are reciprocally depleted and hence compensated to a greater or lesser extent. The advantage of such a compensation component is that it has a significantly reduced on-resistance compared with conventional semiconductor components in forward operation and it has a very good blocking characteristic in reverse operation. The construction and the method of operation of such compensation components is known in many cases and described for example in the U.S. Pat. Nos. 5,216,275 and 5,754,310 as well as in International Publication WO 97/29518, Issued German Patent DE 43 097 64 C2 and Issued German Patent DE 198 40 032 C1. Therefore, a detailed description of the construction and the method of operation of such compensation components is dispensed with below.

Compensation components can be employed in a multiplicity of component variants, such as e.g. MOS transistors, diodes, thyristors, GTOs, IGBTs and the like, although nowadays they are usually used as MOS transistors. Therefore, a field-effect-controlled MOS transistor—also called MOSFET for short—will be taken as a basis below as an example of a compensation component, but without restricting the invention to this semiconductor component.

In all semiconductor components with blocking functionality that are obtainable nowadays, such as e.g. in a MOSFET, the blocking capability thereof is a static component property. If, in such a semiconductor component, the intention is to achieve a very high reverse voltage in a manner governed by the application, this is nonetheless detrimental to other electrical properties of the semiconductor component, such as e.g. impairment of the on resistance $RDS_{on}$ and a lower current-carrying capacity. In particular, Issued German Patent DE 198 40 032 C1 shows a further middle way between breakdown voltage avalanche destruction energies.

Various boundary conditions must be taken into consideration for designing the blocking capability of a semiconductor component.

In a first application, the semiconductor component must be able to carry the breakdown voltages that repeatedly occur when switching large currents and/or voltages, in conjunction with high currents but low energy for a short time. Such semiconductor components are used as power switches for switching large loads such as e.g. in switched-mode power supplies, switching regulators, pulsed power supplies and the like.

In such circuit arrangements, leakage inductances in the µH range (a few 10 µH) consequently arise depending on the quality of the circuit layout and the transformer. These leakage inductances are not buffered via the load-relieving elements, e.g. buffer capacitances, that are typically provided in the circuit arrangement, and therefore drive the semiconductor component into avalanche breakdown. The breakdown typically lasts only a very short time, namely precisely until the energy stored in the leakage inductance has been completely dissipated. In these cases, the semiconductor component must be designed in a manner governed by the application in such a way that it can take up the energy emitted by the leakage inductances for the duration of the breakdown, so that its functionality is not impaired for identical breakdowns recurring later.

In a second application, the blocking capability of the semiconductor component must also be designed for controlling operating states which occur very rarely and which demand a significantly higher reverse voltage than in the first application. By way of example, it can happen in power semiconductor components which are used in switched-mode power supplies designed as flyback converters and in power factor controllers (PFC) that such high voltage spikes are coupled in via the supply voltage source that they can no longer be filtered out via an input filter. These voltage spikes in the supply voltage lead equally to significantly excessively increased voltage spikes in the load circuit of the power semiconductor component. Thus, by way of example, also when a gas discharge lamp is driven by a conventional half-bridge circuit or a high-side or low-side power transistor, higher voltage spikes than in normal operation can occur when the lamp is switched on or in the event of repeated ignition pulses. This dissipation of energies just mentioned can lead, in the extreme case, to the thermal destruction of the semiconductor component. In order to ensure the functionality of the entire circuit arrangement even in the case of an extraordinary high overvoltage, it is necessary to provide a semiconductor component that is designed for a significantly higher reverse voltage.

The reverse voltages required for the second application are significantly higher than those for the first application. By way of example, a semiconductor component which is designed for a reverse voltage of 600 V has a breakdown voltage for the first application in the range of 300–400 V reverse voltage. Therefore, conventional semiconductor components must be dimensioned toward the second application with respect to their blocking capability. However, this has the disadvantage that the on resistance $RDS_{on}$ is significantly increased and the semiconductor component, thus has a significantly poorer "cost-performance" ratio.

If the semiconductor component is designed only for the first application, that is to say for a significantly reduced reverse voltage, although it has a significantly reduced on resistance $RDS_{on}$, this semiconductor component, and consequently, the entire circuit arrangement would be irreversibly damaged or even destroyed in the case of a voltage breakdown according to the second application.

Thus, there is a need to provide a semiconductor component that is designed for the first application with respect to its blocking capability, but that nevertheless remains functional even in the case of a voltage breakdown according to the second application.

However, a semiconductor component with a functionality of this type has not been disclosed heretofore.

SUMMARY OF THE INVENTION

It is accordingly an object of the invention to provide a semiconductor component with the functionality mentioned above.

Accordingly, a generic compensation component according to the principle of charge carrier compensation is provided which is designed in such a way that its breakdown voltage increases at constant temperature as a function of time.

Accordingly, the following are provided:
a semiconductor component functioning according to the principle of charge carrier compensation, in which incompletely ionized dopants are additionally provided in the semiconductor body of the semiconductor component. With application of a reverse voltage, the degree of compensation changes as a function of time and the breakdown voltage of the semiconductor component increases in a manner governed by this; and
semiconductor components of the generic type in which incompletely ionized dopants of the first or second conduction type are additionally provided into the already doped compensation layer.

The invention thus provides a semiconductor component with a breakdown voltage that rises with respect to time. This semiconductor component is designed for the "normal", lower breakdown voltage required in continuous operation and nevertheless has an additional voltage reserve to which recourse is had as required and by means of which the semiconductor component has a higher breakdown voltage in an exceptional case. Such a fundamentally novel functionality opens up an additional degree of freedom in the design of semiconductor components. What is more, a multiplicity of new applications are opened up for such semiconductor components.

A compensation layer is a mandatory requirement for the technical realization and the function of such a semiconductor component with a breakdown voltage that rises with respect to time. In other words, it is necessary to provide a semiconductor layer having alternate regions of different conduction types. However, a specific configuration of this compensation structure is not necessary, i.e. the regions of different conduction types that are provided for the purpose of charge separation need not necessarily be aligned with the cells of a cell array or be connected to the cells, but rather can be arranged more or less arbitrarily below the cell array. Furthermore, the exact shaping of the compensation structures is likewise not predetermined, i.e. they may include contiguous pillars, strips, or else non-contiguous ball-like structures. Moreover, these regions need not necessarily have the same doping concentrations.

The principle of the semiconductor component according to the invention with a breakdown voltage that rises with respect to time is based on the physical effect that part of the space charge that contributes to the charge carrier compensation, when a reverse voltage is applied to the semiconductor component, takes effect in a time-delayed fashion. This physical mechanism is known as incomplete ionization. For this purpose, doping elements are provided which are only partly ionized under "normal" conditions, i.e. at the operating temperature of the semiconductor component or at room temperature, with the result that only the ionized portion of this dopant can contribute to the current flow. Elements of this type are also referred to hereinafter as elements with incomplete ionization or incompletely ionized elements. When an electric field is applied and/or with rising temperature, the degree of ionization rises in the case of such incompletely ionized elements.

If, in a conventional semiconductor component without a compensation structure, part of the doping were replaced by identically doping elements with incomplete ionization, the breakdown voltage would even decrease as a function of time, to be precise more rapidly in the warmer regions of the semiconductor component than in the colder regions. Such a semiconductor component would thus have a breakdown voltage characteristic that decreases with time, which is precisely what is not desired for the applications mentioned in the introduction.

According to the invention, the compensation layer has dopants with incomplete ionization, in which case care should be taken to ensure that the dopants with incomplete ionization in the compensation layer are contained at least in the regions of the same conduction type. Examples of n-doping and p-doping dopants with incomplete ionization that can be used are selenium and palladium, which have a degree of ionization of about 20% at room temperature. When selenium is used, care should thus be taken to ensure that this dopant is arranged at least in the n-doped regions of the compensation layer. Equally, when palladium is used, this element should be arranged at least in the p-doped regions of the compensation layer. The introduction of both selenium and palladium, i.e. in each case different doping elements with incomplete ionization, into the compensation layer should be avoided as much as possible.

If no reverse voltage is present across the compensation layer, then only a portion of the elements with incomplete ionization—about 20% in the case of selenium or palladium—is ionized and is thus electrically active. The semiconductor component is designed for a low breakdown voltage—for example 300 V—in this state. If a reverse voltage is applied to this semiconductor component and the space charge zone caused as a result extends to the compensation layer, then the degree of ionization of the dopants rises with increasing time, and the charge carriers which thus become free and also the existing charge carriers of the background doping are transported away immediately by the space charge zone. The dopants with incomplete ionization are ionized further and extracted from the electric field until the maximum degree of ionization is reached. In this state, the semiconductor component reaches the maximum breakdown voltage—for example 600 V—on account of the completely ionized dopants with incomplete ionization and the dopants of the background doping.

The semiconductor component according to the invention may advantageously be designed to be strongly n-loaded. A strongly n-loaded design of a semiconductor layer is produced if the degree of compensation is $K \geq 20\%$, in particular $K \geq 30\%$. In this case, the breakdown voltage can be reduced to a very great extent below the specified limit of the maximum breakdown voltage of, for example, 600 V, for example, to 300 V. In this case, the p-conducting compensation structure may be designed to be very weak, or in the limiting case, even include weak n-doped regions. In the switched-on state, the doping element that is responsible for the temporal delay of the breakdown voltage is incompletely ionized. In this case, the non-ionized portions also do not generate a transverse electric field and the formation of a parasitic junction FET transistor (J-FET) does not occur. As the degree of ionization rises, the profile of the electric field becomes flatter and the breakdown voltage rises as a result of this. However, the breakdown strength also decreases as a result, since there is a reduction in the difference in the local space charge density toward a perfect compensation of the charge carriers.

In a further, highly advantageous design, the compensation structure may also be designed to be very strongly p-loaded. A strongly p-loaded design of a semiconductor layer is again produced in this case if the degree of compensation is $K \geq 20\%$, in particular $K \geq 30\%$. In this case, the time-delayed effect is achieved by oppositely doped elements with incomplete ionization—for example using palladium. In this case, the voltage breakdown is moved deep into the space charge zone. As a result, the loading on the edge region of the semiconductor component is likewise reliably relieved.

In an advantageous refinement of the invention, it is also possible for the dopants with incomplete ionization not to be arranged exclusively in the identically doped regions of the compensation layer. Since the elements with incomplete ionization, such as e.g. selenium and palladium, have a relatively high diffusion coefficient, it is particularly advantageous for these elements to be structured in an extensive fashion or to be distributed over the entire compensation layer. In the case of a large-area introduction of the elements with incomplete ionization into the regions of opposite conduction type, the elements have a compensating effect with regard to the doping locally present there. In this case, care should be taken to ensure that the doping concentration is kept in these regions, i.e. is increased by the doping of the element with incomplete ionization. In the regions of the same conduction type, the elements with incomplete ionization act in the sense of the invention.

Those materials which are actually only partly ionized at the operating temperature of the semiconductor component are particularly advantageous as elements with incomplete ionization. In this case, the distance between the doping level of these materials and the respective band edge defines the degree of ionization, and also the thermal generation rate and thus the temporal behavior of the breakdown voltage. Selenium is primarily suitable as an n-doping element with incomplete ionization, and palladium is primarily suitable as a p-doping element. However, the invention shall not be restricted to these elements. Rather, instead of these elements, it is also possible to use other elements with incomplete ionization. For example, it is also possible to use bismuth, titanium, tantalum, etc., as an n-doping element. As an alternative, indium or thallium could also be used as a p-doping element.

In an advantageous refinement, the incompletely ionized element is provided in a doping concentration in the range from 20 to 100%, in particular greater than 50%, of the doping concentration of the same conduction type in the respective zone.

In a typical refinement, a drain zone is provided, which is adjoined by the compensation layer in a large-area manner. Furthermore, the compensation layer advantageously has a drift zone that is arranged between the depletion zones and the complementary depletion zones and the drain zone and adjoins these zones. This drift zone—in particular in the case of a MOSFET—has a lower doping concentration than the depletion zones and complementary depletion zones and the drain zone.

For the case where the drain zone has the same doping type as the source zone and also the complementary depletion zones, what is advantageously involved is a semiconductor component designed as a MOSFET—in particular as a power MOSFET. For the case where the drain zone has an opposite conduction type, a semiconductor component designed as an IGBT is advantageously produced.

In a typical and technologically particularly advantageous refinement, the compensation layer has either a single depletion zone and a multiplicity of complementary depletion zones or a single complementary depletion zone and a multiplicity of depletion zones.

In a further refinement of the invention, the compensation layer is configured in such a way that the incompletely ionized dopants contained therein are only partly ionized at room temperature, their degree of ionization increasing as the temperature rises.

The semiconductor component typically has a cell array having a multiplicity of cells; at least one individual transistor being arranged in each cell. These individual transistors, which are connected in parallel via their load paths and can be controlled via a common driving arrangement, define an active region. The active region of the cell array contains a first region in which the doping concentration of the incompletely ionized elements is higher than in the remaining regions of the active region. In this way, the region in which the semiconductor component first breaks down can be stipulated in a defined manner.

The semiconductor component has an active region, which contributes to the current flow, and an edge region, via which, when a voltage is applied to the semiconductor component, the field lines are led in a defined manner from the semiconductor body. In this case, the doping concentration of the incompletely ionized dopants decreases from the active region of the cell array toward the edge region thereof.

The semiconductor body is advantageously composed of crystalline silicon or silicon carbide. However, it goes without saying that the invention can also be employed with other semiconductor materials, such as e.g. gallium arsenide, germanium, etc.

The invention is suitable in particular in the case of power semiconductor components such as e.g. MOSFETs—in particular power MOSFETs. However, the invention shall not restricted to MOSFETs, but rather can be extended within the scope of the invention to any desired semiconductor components with a compensation structure, for example J-FETs, IGBTs, diodes, thyristors and the like.

The semiconductor component according to the invention is primarily suitable in the case of circuit arrangements having a modified RCD snubber. Besides the known elements such as resistor, diode and capacitor, the RCD snubber additionally has a zener diode with a high reverse voltage. This RCD snubber modified with the additional zener diode advantageously functions as a load-relieving network which takes effect only starting from a specific voltage difference $\Delta V$. The load-relieving network can be employed with all circuit arrangements in which a local voltage increase has to be compensated for after the switch-off, that is to say advantageously in the case of a switched-mode power supply, a pulsed power supply, a voltage regulator or the like.

Other features which are considered as characteristic for the invention are set forth in the appended claims.

Although the invention is illustrated and described herein as embodied in a compensation component, a circuit configuration, and a method, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
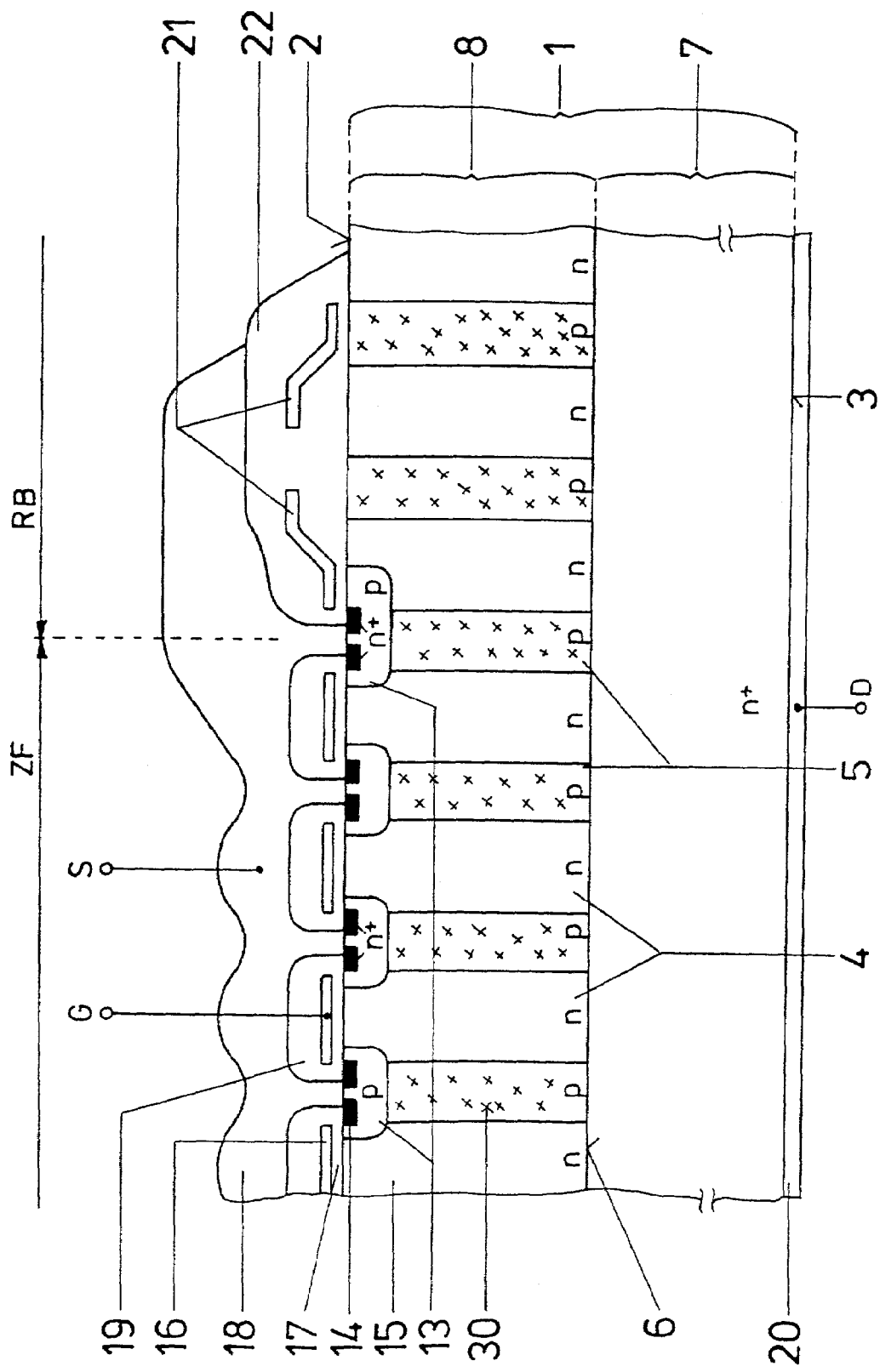
FIG. 1 shows a partial section through a first exemplary embodiment of a vertically designed compensation component.

In all of the figures of the drawing, unless specified otherwise, identical or functionally identical elements and signals have been provided with the same reference symbols.

Referring now to the figures of the drawing in detail and first, particularly, to FIG. 1 thereof, there is shown a partial section through a detail of an inventive vertically designed compensation component that is designed in this case as an n-channel MOSFET.

In FIG. 1, the reference numeral "1" designates a semiconductor body—for example a monocrystalline silicon wafer. The semiconductor body 1 has a first surface 2, the so-called front side of the wafer, and a second surface 3, the so-called rear side of the wafer. The semiconductor body has a drain zone 7 which is heavily n-doped at the surface 3 and is connected to the drain terminal D via a drain metallization layer 20 applied to the surface 3 in a large-area manner. The side opposite to the surface 3 is adjoined by the compensation it layer 8 of the compensation component. The compensation layer 8, which has the function of the drift path in a compensation component, has doping regions 4, 5 of both conductivity types which are arranged alternately next to one another and form the compensation structure. The p-doped regions 5 are also referred to hereinafter as depletion zones, while the n-doped regions 4 are referred to as complementary depletion zones.

In the present exemplary embodiment, the compensation layer 8 is designed as an epitaxial layer that is grown by the deposition of n-doped silicon onto the boundary layer 6. The depletion zones 5 can subsequently be introduced into the semiconductor body 1 by suitable methods. It would also be conceivable for a p-doped or undoped epitaxial layer to be deposited, into which the n-doped regions 4 and/or p-doped regions 5 are introduced.

At the surface 2, a plurality of p-doped body zones 13 are embedded in the compensation layer 8. One or more heavily n-doped source zones 14 are embedded in each body zone 13. The body zones 13 and source zones 14 can be introduced into the semiconductor body 1 in a known manner by ion implantation or diffusion and/or can be applied to the semiconductor body 1 by epitaxy. At the surface 2, the body zones 13 are spaced apart from one another by an intermediate zone 15, which are part of the complementary depletion zones 4, and thus also have the doping thereof. A gate electrode 16 is in each case provided above the intermediate zones 15. The gate electrodes 16 extend laterally as far as the source zones 14. The gate electrodes 16 are insulated from the surface 2 by a thin gate oxide 17. Furthermore, a source metallization layer 18 is provided, which makes electrical contact with the source zones 14 and body zones 13 via a shunt and which is spaced apart from the gate electrode 16 by a protective oxide 19. At the front side of the semiconductor body 1, the source metallization layer 18 is connected to a source terminal S and the gate electrode 16 is connected to a gate terminal G.

In the layout of the semiconductor body 1, the regions covered with gate electrodes 16 and also with body zones 13 and source zones 14 designate the cell array ZF of the compensation component. The cell array includes a multiplicity of cells. A cell in each case includes an individual transistor. The parallel circuit formed by the load paths of the multiplicity of individual transistors produces the MOSFET of the compensation component. A compensation component typically also has an edge region RB, which is arranged outside the cell array ZF and which, during operation of the compensation component, is intended to ensure a defined profile of the field lines in the edge region. Field plates 21 are provided in the edge region RB and are likewise insulated from the semiconductor body 1 and the source metallization layer 18 by a protective oxide 22.

The cells of the cell array ZF and also the compensation structures form a grid. In the present exemplary embodiment, the regions 4, 5 are connected to the body zones 13, and the grid of the cell array is aligned with the grid of the compensation layer. However, it would also be conceivable for the two grids to be not aligned with one another, or for the regions 4, 5 to be not connected to the structures of the cell array ZF.

In FIG. 1, the depletion zones 5 and complementary depletion zones 4 are aligned with the grid of the cell array ZF, but it would also be conceivable, of course, for these zones 4, 5 to be arranged such that they are not aligned with the cell array.

In the example in FIG. 1, the regions 4, 5 are of a laterally strip-shaped and a vertically pillar-shaped design, but a different design would also be conceivable.

The gate electrodes 16 typically include polysilicon, but they may also include a different material, for example metal or silicide, although these materials are not as advantageous as highly doped polysilicon in terms of production engineering because of their physical and electrical properties. Equally, for the gate oxide 16 and protective oxide 19, 22, instead of silicon dioxide ($SiO_2$), it is also possible to use any other insulating material, for example silicon nitride ($Si_3N_4$), or else a vacuum, but thermally produced silicon dioxide, in particular when used as gate oxide, exhibits the highest quality and is therefore preferred. Aluminum or an aluminum alloy—such as, for example, AlSi, AlSiCu, or the like—is typically used as the source metallization layer 18 and drain metallization layer 20, but any other highly conductive material which ensures a good contact with the semiconductor body could also be used here.

According to the invention, a p-doping dopant 30 with incomplete ionization is then introduced in the p-doped regions. In the example in FIG. 1, the regions containing this element have been illustrated by crosses 30. It is assumed below that palladium is used as the p-doping element 30 with incomplete ionization.

Figure 2:
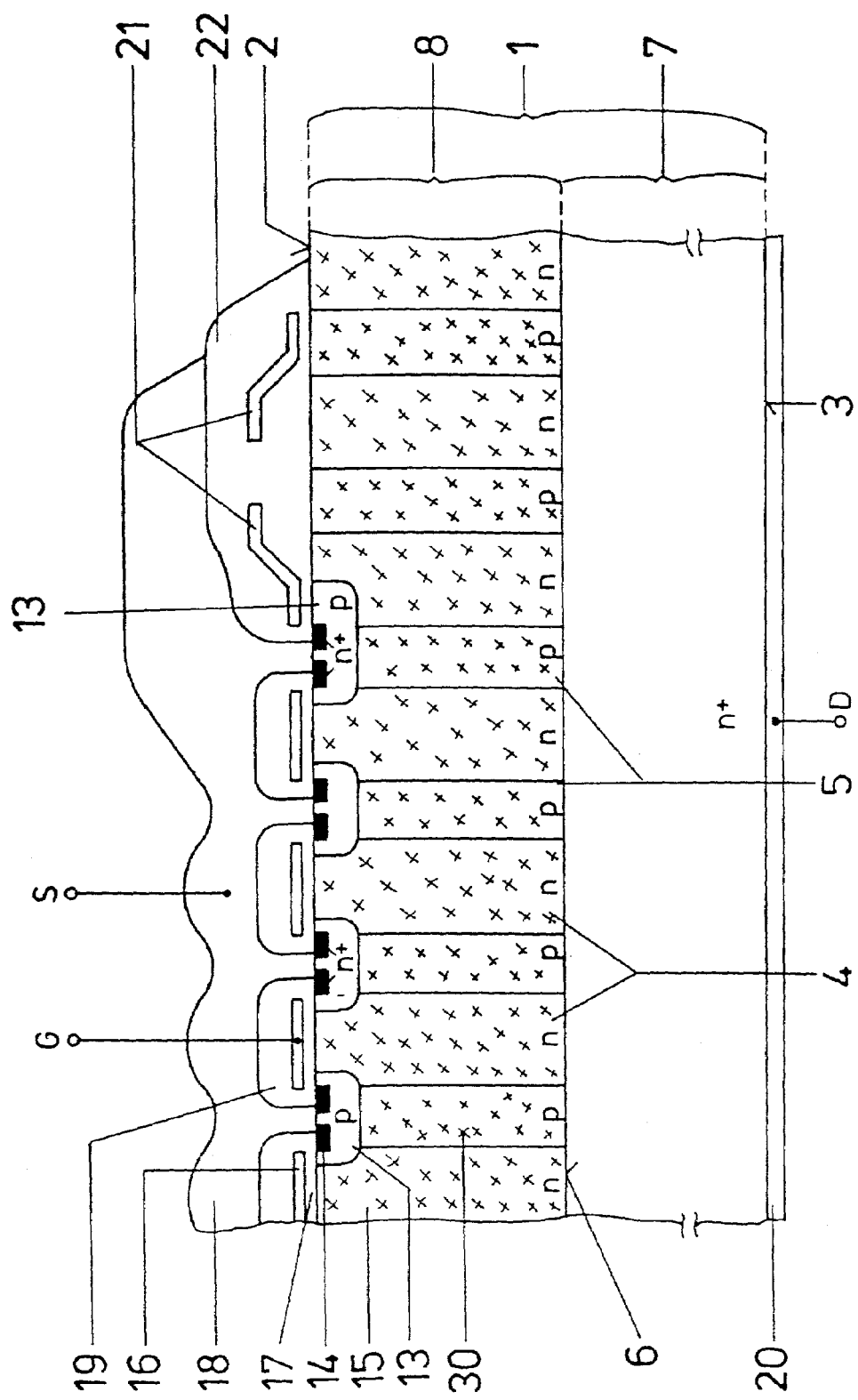
FIG. 2 shows a partial section through a second exemplary embodiment of a vertically designed compensation component.
Figure 3:
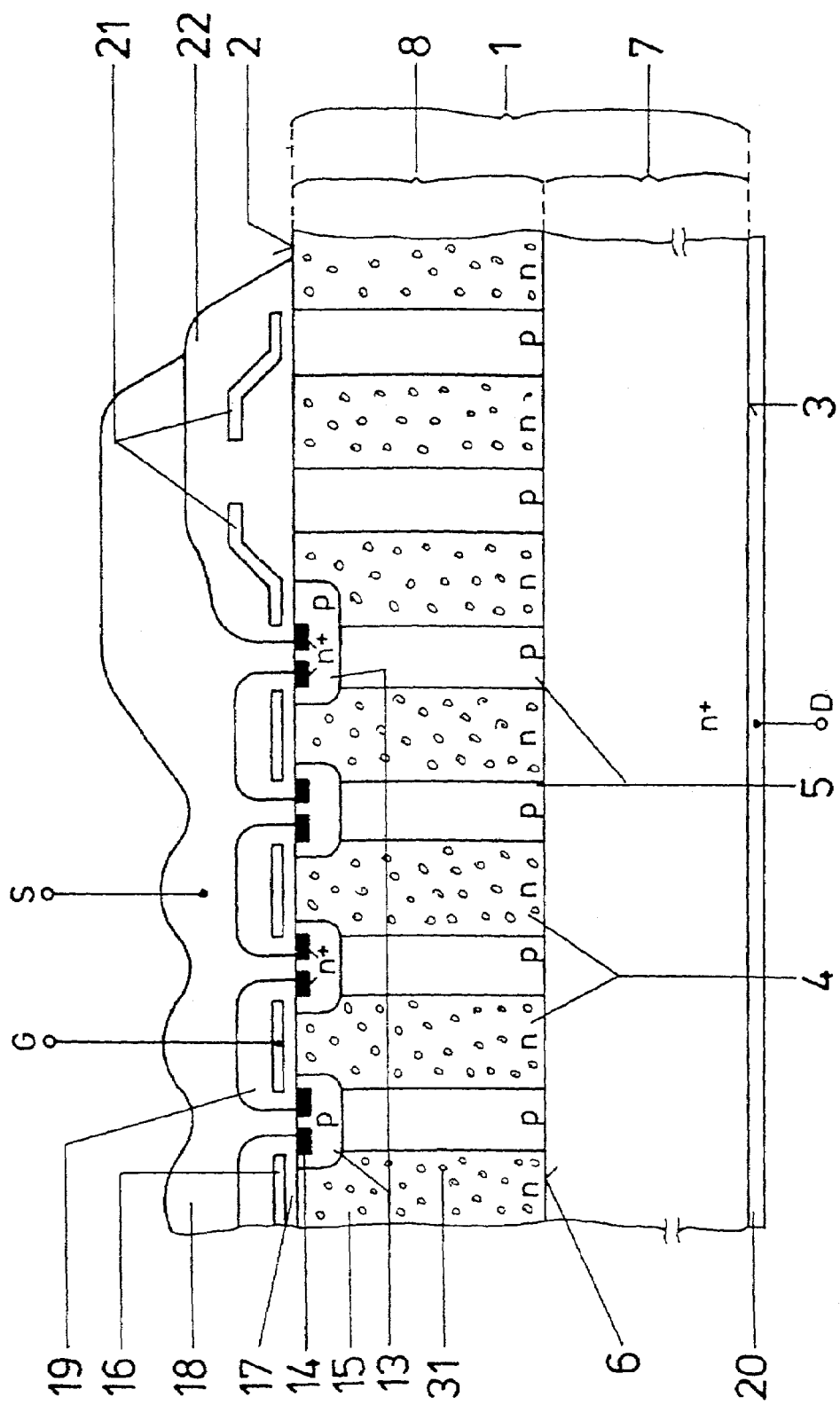
FIG. 3 shows a partial section through a third exemplary embodiment of a vertically designed compensation component.

The compensation component shown in FIG. 2 is distinguished from that in FIG. 1 by the fact that the p-doping element 30 is introduced in a manner distributed over the entire compensation layer, that is to say both in the p-doped regions 5 and in the n-doped regions 4. The compensation component in shown in FIG. 3 is distinguished from that shown in FIG. 1 by the fact that, instead of palladium 30 in the p-doped regions, selenium 31 (circles) has been introduced in the n-doped regions. Furthermore, it would be conceivable here, too, to distribute selenium over the entire compensation layer 8.

Figure 4:
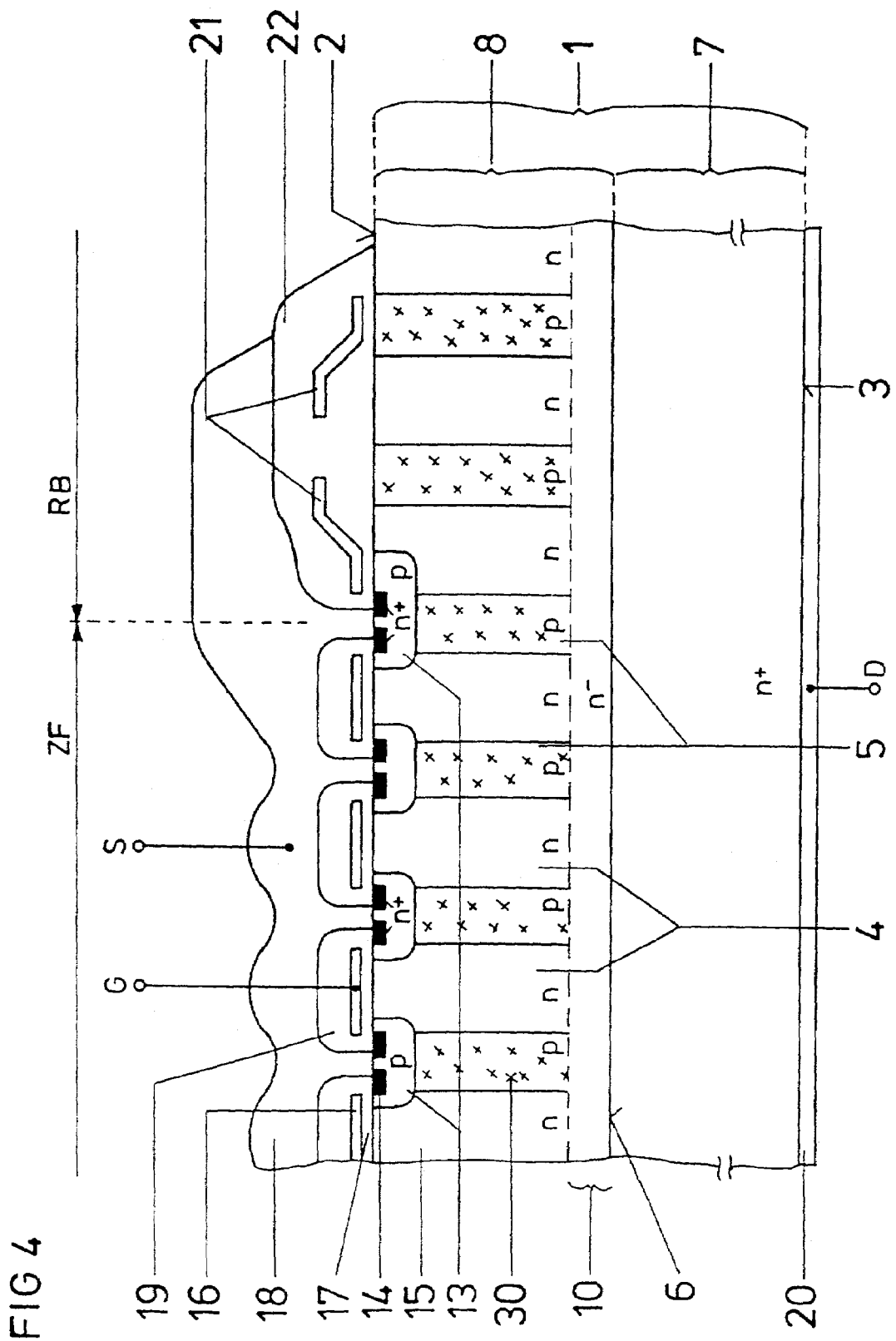
FIG. 4 shows a partial section through a fourth exemplary embodiment of a vertically designed compensation component.

FIG. 4 shows a partial section through a fourth exemplary embodiment of an inventive vertically designed compensation component. The semiconductor component in FIG. 4 differs from the semiconductor component illustrated in FIG. 1 in particular in the construction of the compensation layer 8. In this case, the depletion zones 5 and complementary depletion zones 4 of the compensation layer 8 are not connected to the rear-side drain zone 7. A weakly n-doped drift zone 10 is additionally arranged between the zones 4, 5 and the rear-side drain zone 7. The zones 4, 5 are thus of floating design to a greater or lesser extent in the compensation layer 8. With regard to the configuration of the compensation layer 8, in particular for technological reasons, the semiconductor component illustrated in FIG. 4 forms the most advantageous embodiment. This embodiment is preferred over the exemplary embodiments that are illustrated in FIGS. 1–3, and in which the compensation layer 8 is directly connected to the drain zone 7.

Figure 5:
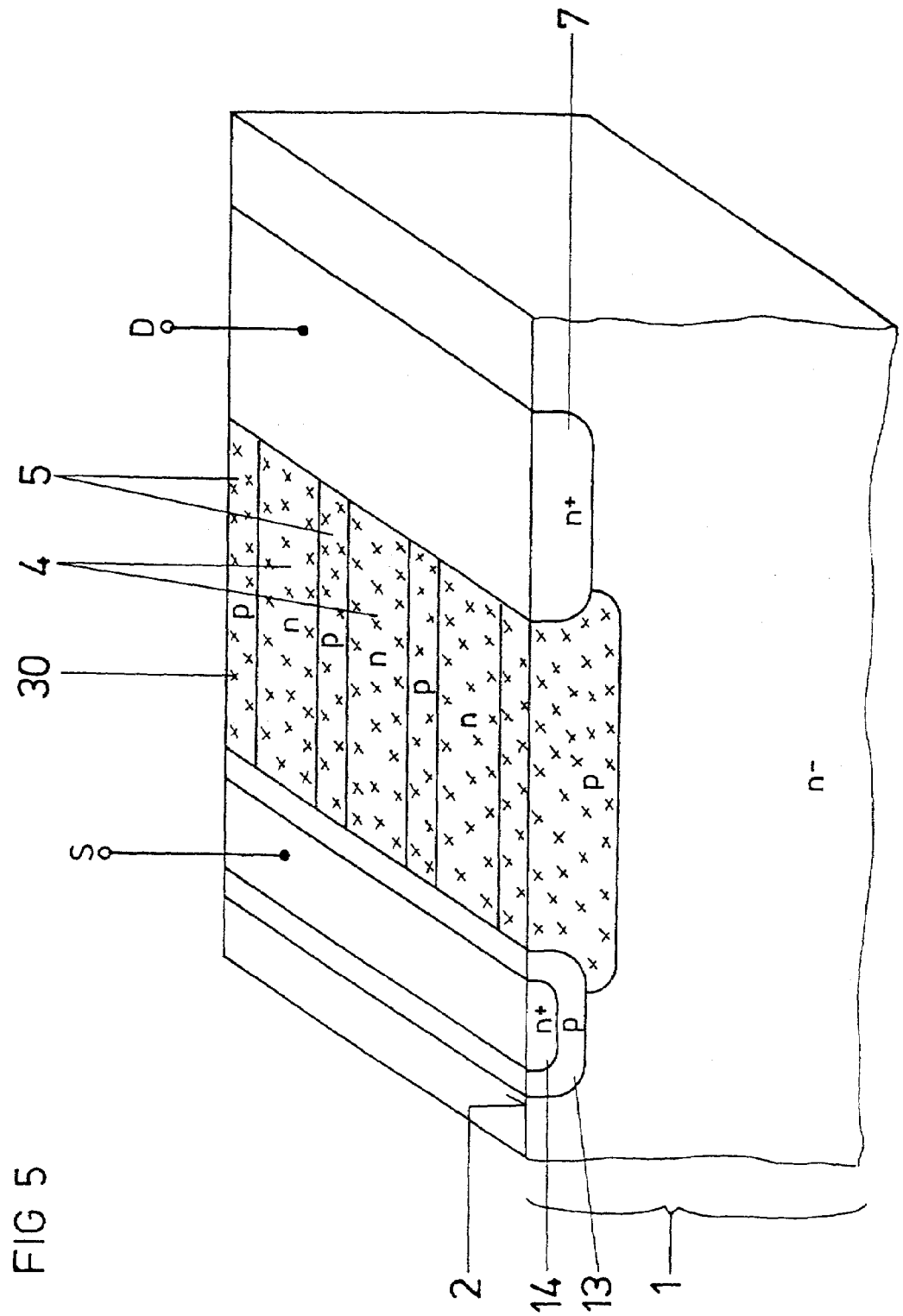
FIG. 5 shows a perspective view of a detail of a laterally designed compensation component.

FIG. 5 shows a perspective view of a detail of a laterally designed compensation component. FIG. 5 differs from the exemplary embodiment in FIG. 2 by the fact that the structures of the compensation layer are arranged laterally, that is to say the drain and source electrodes D, S are situated at the same surface 2 of the semiconductor body 1, thereby resulting in an essentially lateral current flow near the surface. The incompletely ionized dopants 30 are in this case distributed over the entire compensation layer (crosses), that is to say both in the n-doped regions 4 and in the p-doped regions 5. The illustration of the passivation layers and electrodes arranged at the surface 2 has been dispensed with to provide a better overview.

Figure 11A:
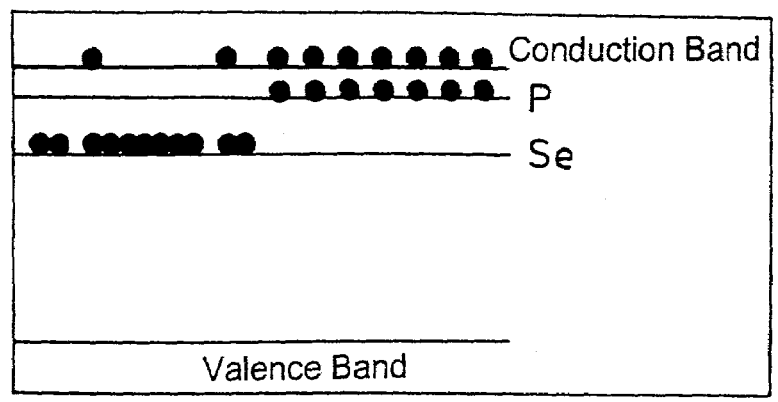
FIG. 11 shows the band model in the field-free case (a) and in the case of a n applied electric field (b)

The time-delayed activation mechanism—according to the invention—of the incompletely ionized elements arranged in the compensation layer 8 functions as follows:

In the field-free case and at a given temperature—for example at room temperature—practically all the "normal" doping dopants (phosphorus), but only a portion of the elements with incomplete ionization (Se) are ionized (see FIG. 11(a)). The degree of ionization of the incompletely ionized elements, which defines the proportion of ionized and thus electrically active charge carriers relative to the total of the charge carriers introduced into the semiconductor body, is less than 100% in this case. When a voltage is applied to the semiconductor component, a space charge zone builds up, which extends from the source zone into the interior of the semiconductor body with increasing voltage. As soon as the space charge zone reaches the regions of the compensation layer, the free charge carriers of the incompletely ionized doping atoms and also all of the charge carriers of the background doping are extracted. Therefore, recombination of the free charge carriers with their ionized atomic residues no longer takes place within the space charge zone.

Figure 11B:
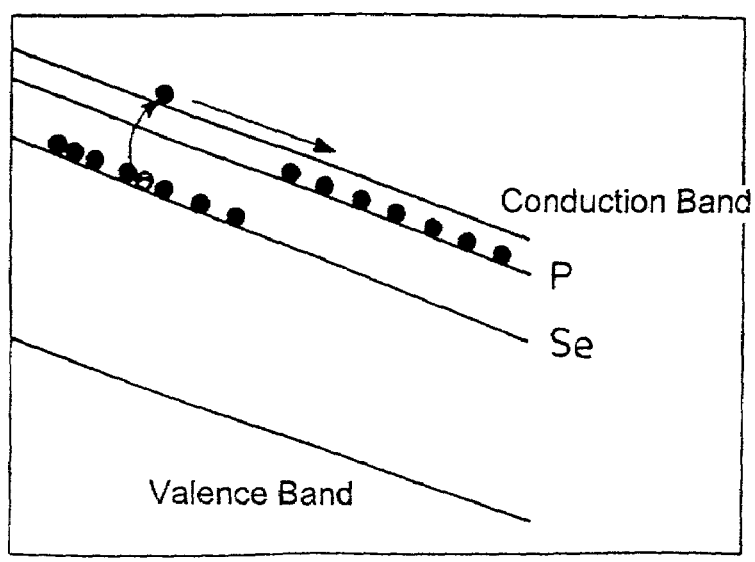

The atoms of the incompletely ionized elements, which atoms are (still) not ionized in this state, initially do not contribute to the total space charge. However, because of the temperature-dependent generation of charge carriers, further free charge carriers are generated from the incompletely ionized elements (see FIG. 11(b)), which are then immediately extracted from the space charge zone. The remaining atomic residues will thus contribute to the total space charge. This operation is continued until all of the atoms of the incompletely ionized elements are ionized. The degree of ionization is then 100%. As a result of the total space charge which rises in this way, the space charge density also rises as a function of time. As a result, the field distribution and thus also the breakdown voltage changes as a function of time. Thus, given a suitable dimensioning, the breakdown voltage becomes larger and larger as a result of the charges that are subsequently supplied with time.

A particularly advantageous side effect results from the fact that the degree of ionization of the doping elements with incomplete ionization also rises as the temperature rises. By way of example, if a specific region of the semiconductor component is severely loaded by a breakdown, then the breakdown current, and thus the temperature rises locally there. However, on account of the additional thermal loading, the degree of ionization of the elements with incomplete ionization rises more rapidly in the "hot" region than in the "colder" regions of the semiconductor component which are loaded to a lesser extent by the breakdown. A higher breakdown voltage thus results in the hotter region of the semiconductor component in comparison with the colder regions of the semiconductor component. Consequently, with regard to the breakdown voltage, a control loop with negative feedback is produced, i.e. the semiconductor component has a self-stabilization of the breakdown behavior.

The presentation of the degree of compensation as a function of the breakdown voltage, which is also referred to hereinafter as the compensation parabola, is described in detail for example in Issued German Patent DE 198 40 032

C1, mentioned in the introduction. In the case of an n-channel MOSFET, the degree of compensation K is defined as follows:

$$K = \frac{Np - Nn}{Nn}$$

where Np and Nn designate the total number of (electrically active, ionized) charge carriers in the p-doped and n-doped region, respectively. In this case, the degree of compensation refers in the sense of a local definition to (typically infinitesimally) thin layers parallel to the surface 3.

Figure 6:
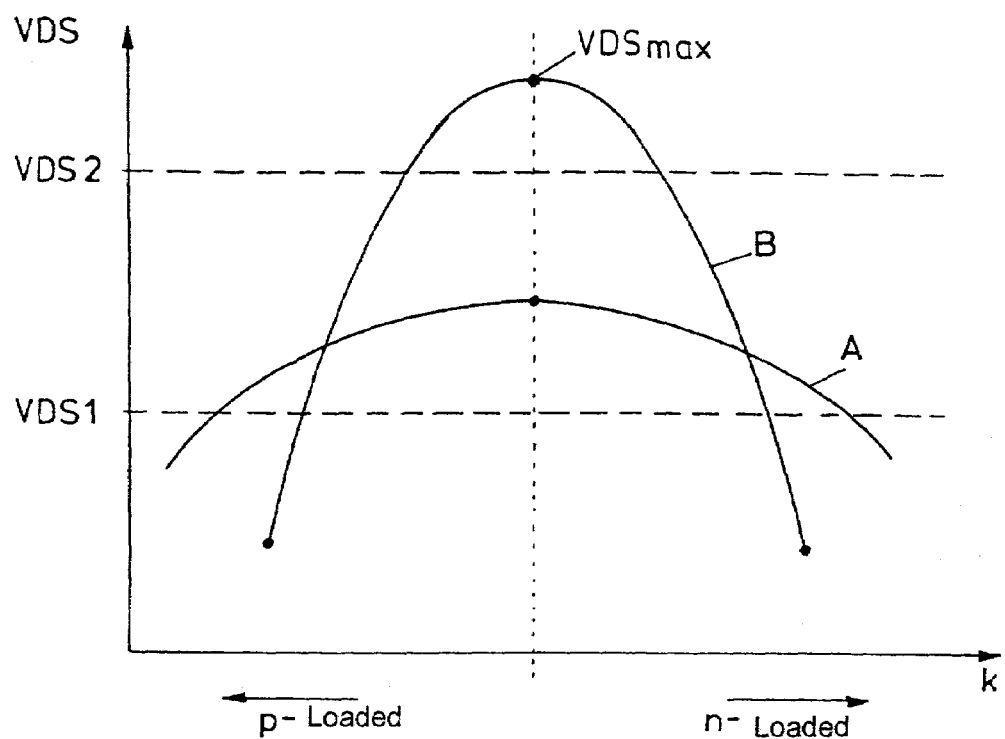
FIG. 6 shows the profile of the breakdown voltage as a function of the degree of compensation for a prior art semiconductor component (A) and for a semiconductor component (B) constructed in accordance with FIG. 1.

FIG. 6 shows the profile of the breakdown voltage VDS as a function of the degree of compensation K for a prior art compensation component (A) and for an inventive n-channel MOSFET (B) constructed in accordance with FIG. 1. In this case, the breakdown voltage VDS in volts is specified on the ordinate, while the abscissa represents the degree of compensation K in percent. Low K values designate a p-loaded and high K values designate an n-loaded configuration of the compensation layer.

It is shown that in the case of the prior art semiconductor component, given the same total concentration of the dopants in the compensation layer, the compensation parabola is rather flat, i.e. the difference in the breakdown voltage at its edges and the maximum is very small in this case. By contrast, the compensation parabola of the inventive compensation component, given the same doping concentrations, but with incompletely ionized dopants, is steeper.

In prior art semiconductor components, this parabola is used for the static setting of the operating point, for example, by way of the doping concentrations of the respective regions. In prior art compensation components, the doping concentrations of the regions in the compensation layer are chosen in such a way that an operating point on the compensation parabola is produced as near as possible to the maximum.

Since the operating point of the inventive compensation component, in contrast to prior art compensation components, is not fixedly predetermined on the compensation parabola, but rather increases with time in the presence of a space charge zone, the operating point on the compensation parabola also changes toward higher breakdown voltages VDS. In this way, it is thus possible to provide a compensation component that has a dynamically varying operating point of the breakdown voltage.

The inventive semiconductor component may, for example, be of strongly n-loaded design, the operating point in normal operation—including the manufacturing variations—lying on the compensation parabola above a first specified breakdown voltage VDS1. Furthermore, the inventive compensation component is designed such that, in the case of complete ionization, the maximum $VDS_{max}$ of the compensation parabola—including the manufacturing tolerance—is greater in a defined manner than a second, higher specified breakdown voltage VDS2. In this case, the inventive compensation component is also designed for the rather infrequent case—mentioned in the introduction—in which a significantly higher breakdown voltage must be taken up in a time-delayed manner.

Figure 7:
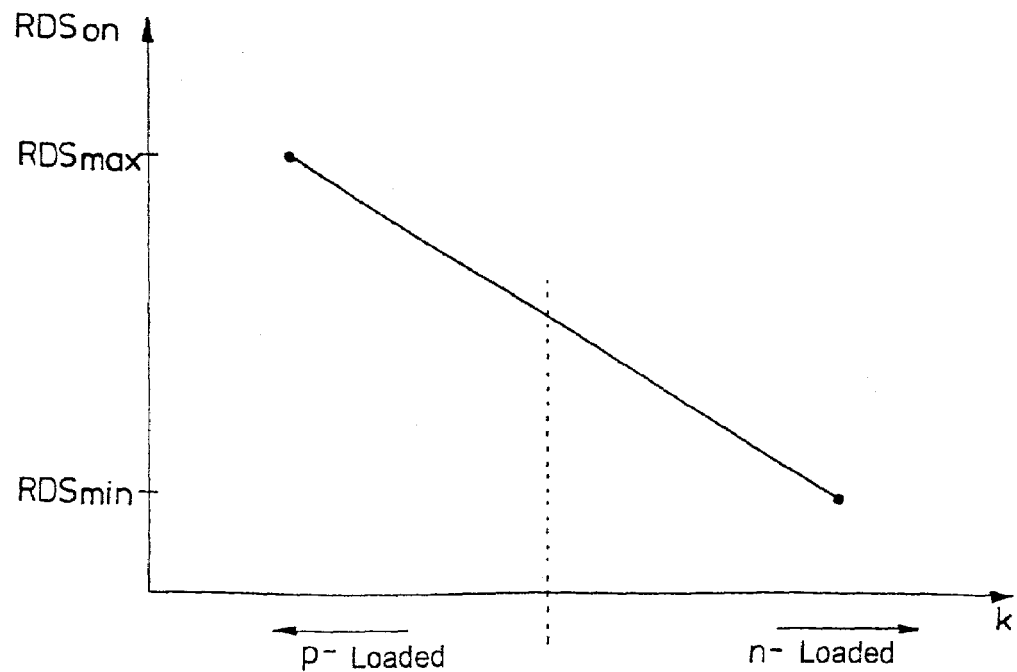
FIG. 7 shows the profile of the on resistance $RDS_{on}$ as a function of the degree of compensation K.

FIG. 7 shows the profile of the on resistance $RDS_{on}$ in the case of an n-channel MOSFET as a function of the degree of compensation K. The left-hand region of the curve represents a p-loaded design and the right-hand region represents an n-loaded design of the compensation layer. FIG. 7 shows that, in the case of an n-channel MOSFET, the lowest on resistances $RDS_{min}$ can be obtained by using an n-loaded design of the compensation layer as much as possible, whereas a p-loaded design of the compensation layer is rather unfavorable since the semiconductor component thus has an increasingly larger on resistance $RDS_{on}$. In this sense, a p-channel MOSFET would have to be of p-loaded design as much as possible.

The limits of an n-loaded nature of the compensation layer are reached if the p-doped regions 5 exclusively contain elements with incomplete ionization and no doping elements whatsoever that are completely ionized at the operating temperature. Conversely, in the case of a maximum p-loaded nature, the n-doped regions would be formed exclusively by n-doping elements with incomplete ionization.

Figure 8A:
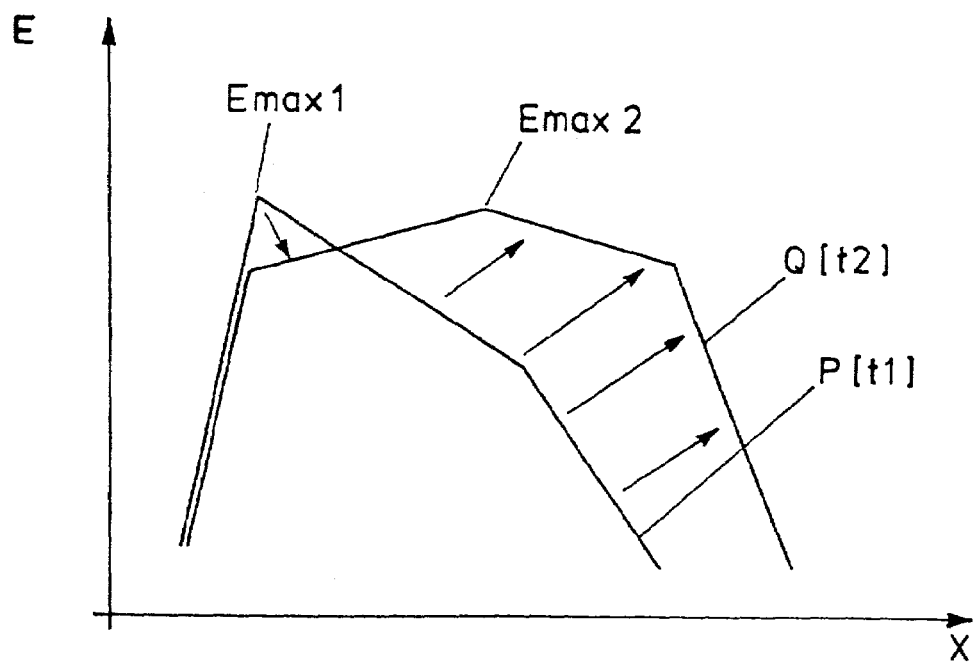
FIG. 8a shows the profile of the electric field as a function of the depth in the case of a semiconductor component that is of n-loaded and that is constructed in accordance with that shown in FIG. 1.
Figure 8B:
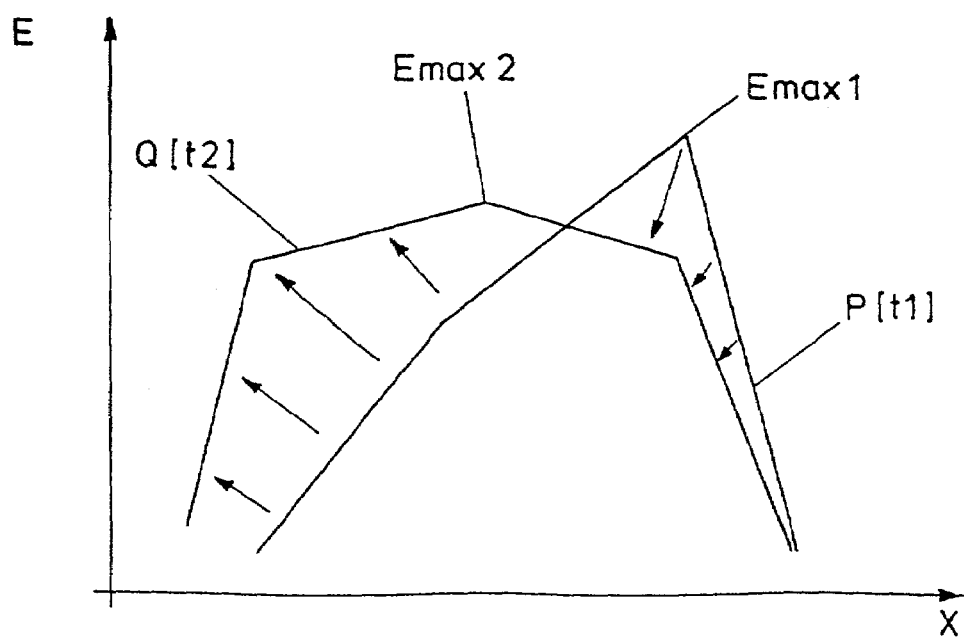
FIG. 8b shows the profile of the electric field as a function of the depth in the case of a semiconductor component that is of p-loaded and that is constructed in accordance with that shown in FIG. 1.

FIGS. 8a and 8b show the profile of the electric field E as a function of the depth x for a semiconductor component constructed in accordance with FIG. 2. In this case, the curve P[t1] designates the profile of the electric field E at the instant t1, at which the space charge zone is fully extended, but the incompletely ionized elements are still incompletely ionized. The curve Q[t2] represents the profile of the electric field E at a later instant (t2>t1) with a completely extended space charge zone, and also with complete ionization of the elements with incomplete ionization. It is shown that the profile of the electric field E is not static, but rather varies as a function of time.

In FIG. 8a designates an n-loaded design and FIG. 8b shows a p-loaded design. In the case of an n-loaded design, the field maximum Emax1 is initially on the side of the front side of the wafer, while in the case of a p-loaded design, the maximum of the electric field Emax1 is initially situated in the depth of the semiconductor body. In the first case, the field maximum Emax2 moves into the depth x of the semiconductor body when an electric field is applied, while in the second case it moves out of the semiconductor body. The p-loaded design is more advantageous than the n-loaded design since the semiconductor component thus acquires greater avalanche strength. The component thus becomes more robust.

Figure 10:
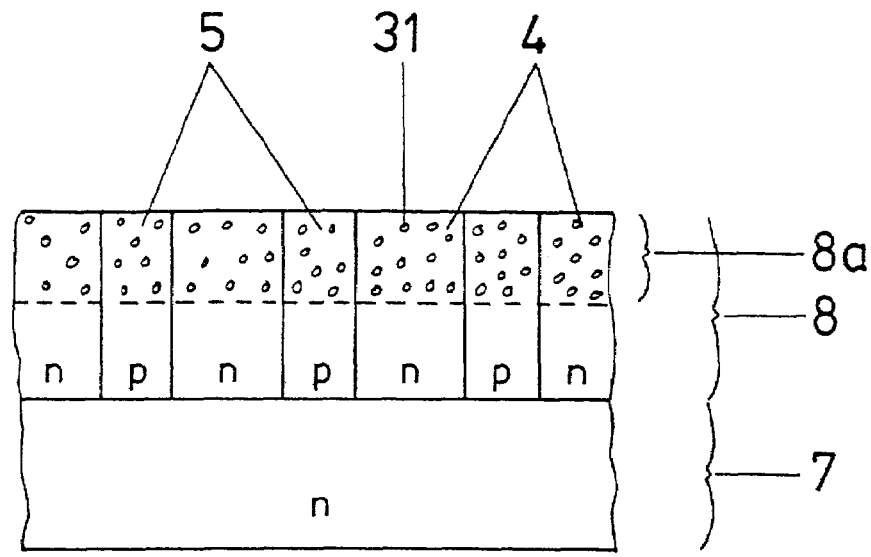
FIG. 10 shows a sketched partial section through a p-loaded design of the compensation layer.
Figure 9:
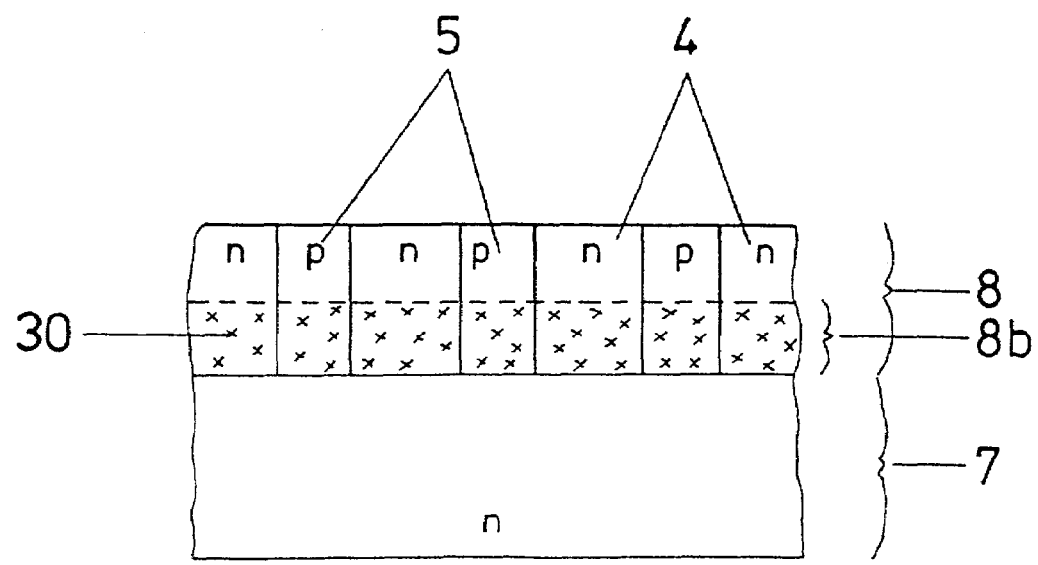
FIG. 9 shows a sketched partial section through an n-loaded design of the compensation layer.

FIGS. 9 and 10 in each case show a sketched partial section through a configuration of an n-loaded design of the compensation layer (FIG. 9) and a p-loaded design of the compensation layer (FIG. 10). In the case of the n-loaded design, the palladium atoms are essentially situated in the lower region of the compensation layer (FIG. 9) and have a homogeneous doping there. In the case of the p-loaded design, the selenium atoms are essentially situated in the upper region of the compensation layer (FIG. 10) and likewise have a homogeneous doping there. The component is of either n-loaded or p-loaded design. It would also be conceivable for the selenium or palladium to be doped not homogeneously, but rather to have a doping which decreases more or less stepwise or progressively into the interior of the compensation layer.

In the case of an n-loaded design (FIG. 8(a)), at the beginning t1, the field maximum Emax1 is situated at the surface x2 of the compensation layer, and it may also be situated in the depth of the semiconductor body in the case of an n-loaded or p-loaded compensation layer. The semiconductor component is extremely robust in both regions. The so-called Kirk effect, which refers to the influencing of the field distribution by the charge carriers associated with the current, is greatly suppressed as a result. With incipient additional ionization of the elements with incomplete ionization, the field profile becomes increasingly flat in order to achieve a time-governed rise in the breakdown voltage. The field maximum Emax2 is shifted into the depth of the semiconductor body. The maximum breakdown voltage is reached after a predetermined period of time, which is determined by the distance between the energy level and the respective band edge, the degree of ionization and the temperature. This period of time typically lies in the range between 500 nsec and 5 µsec, depending on the element.

The situation is exactly reversed in the case of the p-loaded design (FIG. 8(b)).

The field distribution, which changes with respect to time, is particularly advantageous for the stability of the semiconductor component with respect to oscillations that occur, in particular in such semiconductor components with a hallow gradient of the electric field in the region of the field maximum. Such oscillations are also referred to as TRAP-ATT oscillations, which are particularly disturbing, in particular, in the case of compensation components. Consequently, the invention is advantageous if only for this reason, namely the avoidance of TRAPATT oscillations.

The compensation layer is preferably produced by employing the construction technique in which the n-doped and p-doped regions 4, 5 are produced by the alternate deposition of n-doped silicon and by a subsequent masked doping, for example by ion implantation or diffusion. By providing a plurality of these deposition and doping steps, it is possible to provide a desired thickness depending on the desired dielectric strength or current-carrying capability of the compensation component.

As an alternative, for the case where the compensation layer has a doped basic coating, a desired pillar-like structure can be produced by using a masked compartment-type implantation with staggered energies and/or implantation doses. By using high-energy implantation, implantation depths of up to in excess of 50 µm can be achieved with implantation energies of up to 20 MeV, depending on the doping element. A further method is afforded by the electrolytic etching of tubes into the compensation layer. This method for producing the compensation layer is described, for example, in Published European Patent Application EP 0 621 355 A2.

Figure 12A:
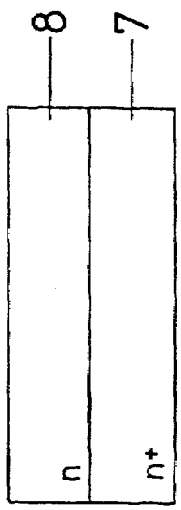
FIGS. 12a–12c show partial sections to explain a first method for producing the inventive compensation layer.
Figure 12B:
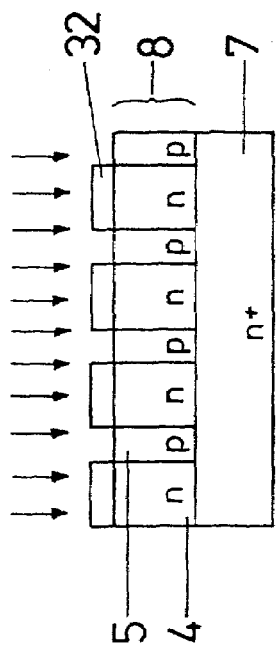
Figure 12C:
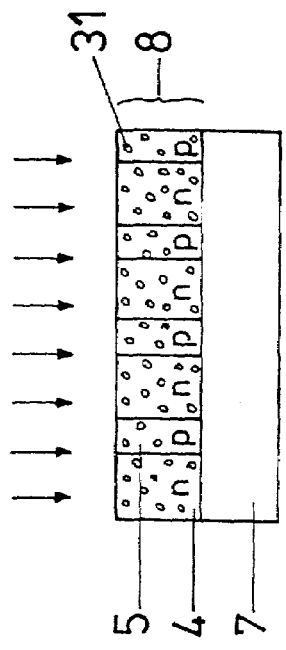

Two fundamentally different methods can be used for introducing the elements with incomplete ionization into the compensation layer. In this case, the intention is only to illustrate the principle; the individual detailed process steps for producing the individual structures, which are well known to the person skilled in the art, are not explained in addition:

The first method is shown using FIGS. 12a–12c. During the doping of the p-type or n-type regions 4, 5, the elements with incomplete ionization are introduced using the same doping mask. In accordance with FIG. 12, the compensation layer 8 has an n-type basic doping as shown in FIG. 12a. After the application of an implantation mask, first the p-doped regions 5 of the compensation layer 8 are produced using the same implantation mask by a diffusion or implantation, as shown in FIG. 12b. Afterward, palladium 31 is introduced into the p-doped regions 5 using the same implantation mask 32, as shown in FIG. 12c.

In this way it is possible to dispense with a masking step. However, on account of the very high diffusion coefficient, palladium will diffuse into the adjacent n-doped regions to a very great extent. The palladium outdiffusing from the p-doped region must therefore be kept in the p- and n-doped region. Consequently, this method is difficult to control.

Figure 13A:
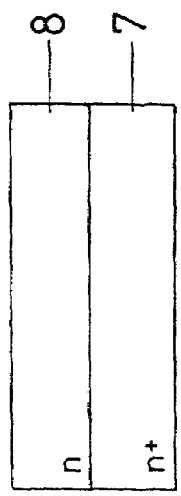
FIGS. 13a–13c show partial sections to explain a second method for producing the inventive compensation layer.
Figure 13B:
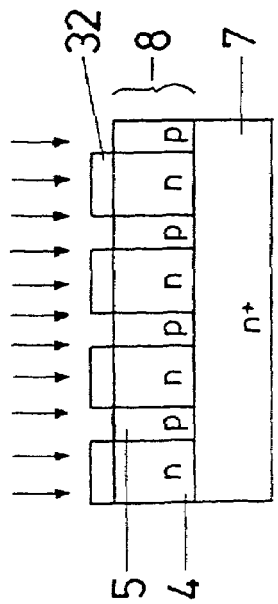
Figure 13C:
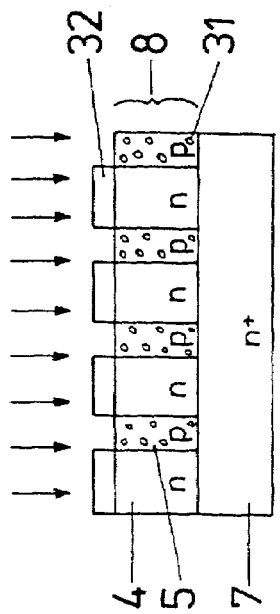

A second method is shown using FIGS. 13a–13c. In accordance with FIGS. 13a–13c, the compensation layer 8 has an n-type basic doping, as shown in FIG. 13a. After the application of an implantation mask 32, first the p-doped regions 5 of the compensation layer 8 are produced by a diffusion or implantation, as shown in FIG. 12b. After the implantation mask 32 has been stripped off, palladium is introduced into the entire compensation layer 8 in a large-area manner, the material being uniformly distributed laterally and over the entire depth of the compensation layer on account of the high diffusion coefficient. It would also be conceivable, however, for the palladium to be already introduced into the basic doping of the compensation layer 8, for example during the epitaxy.

The particular advantage of this second method is that there is no shift in the concentration ratios through diffusion of palladium. It is merely necessary to ensure that the doping concentration in the n-doped regions is kept in such a way that the doping concentration of the p-doping palladium is compensated for there.

Figure 14A:
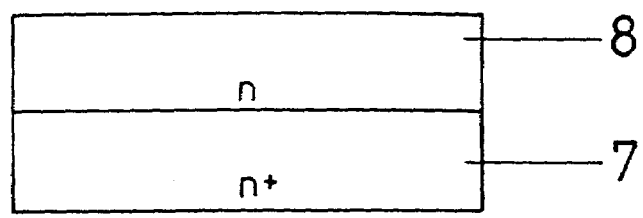
FIGS. 14a–14c show partial sections to explain a third method for producing the inventive compensation layer.
Figure 14B:
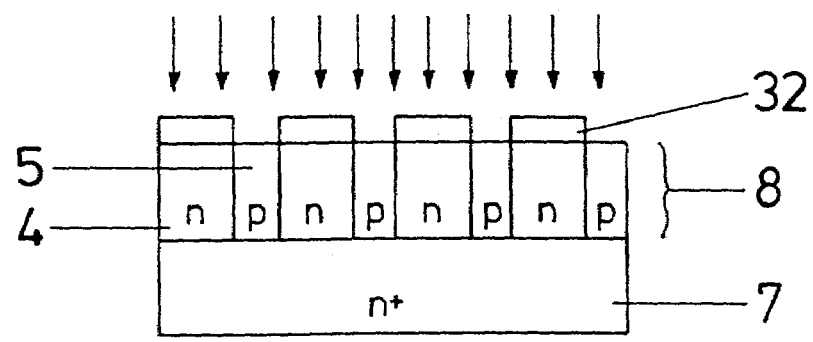
Figure 14C:
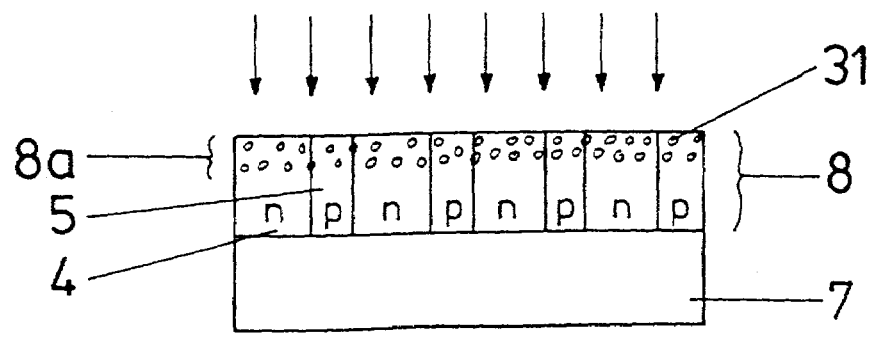

A third method is shown using FIGS. 14a–14c. The method illustrated in FIGS. 14a–14c differs from that in FIGS. 13a–13c by virtue of the fact that selenium is implanted and indiffused only in the upper region 8a of the compensation layer 8, which region adjoins the surface, as shown in FIG. 14c. A p-loaded semiconductor component is provided as a result (see FIG. 10). In the case of an n-loaded design, palladium would have to be implanted and diffused into the depth of the compensation layer 8 (see FIG. 10). This lower part 8b then adjoins the drain zone 7.

The invention shall not be exclusively restricted to the exemplary embodiments shown in FIGS. 1 to 5 and the methods described in accordance with FIGS. 12a–c, 13a–c, and 14a–c. Rather, a multiplicity of new component variants can be specified, for example, by interchanging the conductivity types n for p and by varying the doping concentration. With regard to further exemplary embodiments, reference is also made to the following documents mentioned in the introduction: U.S. Pat. Nos. 5,216,275, 4,754,310, International Publication WO 97/29518, Published German Patent DE 43 09 764 C2 and Published German Patent DE 198 40 032 C1, whose subject matters are hereby incorporated by reference in their entirety into the present patent application.

Figure 15:
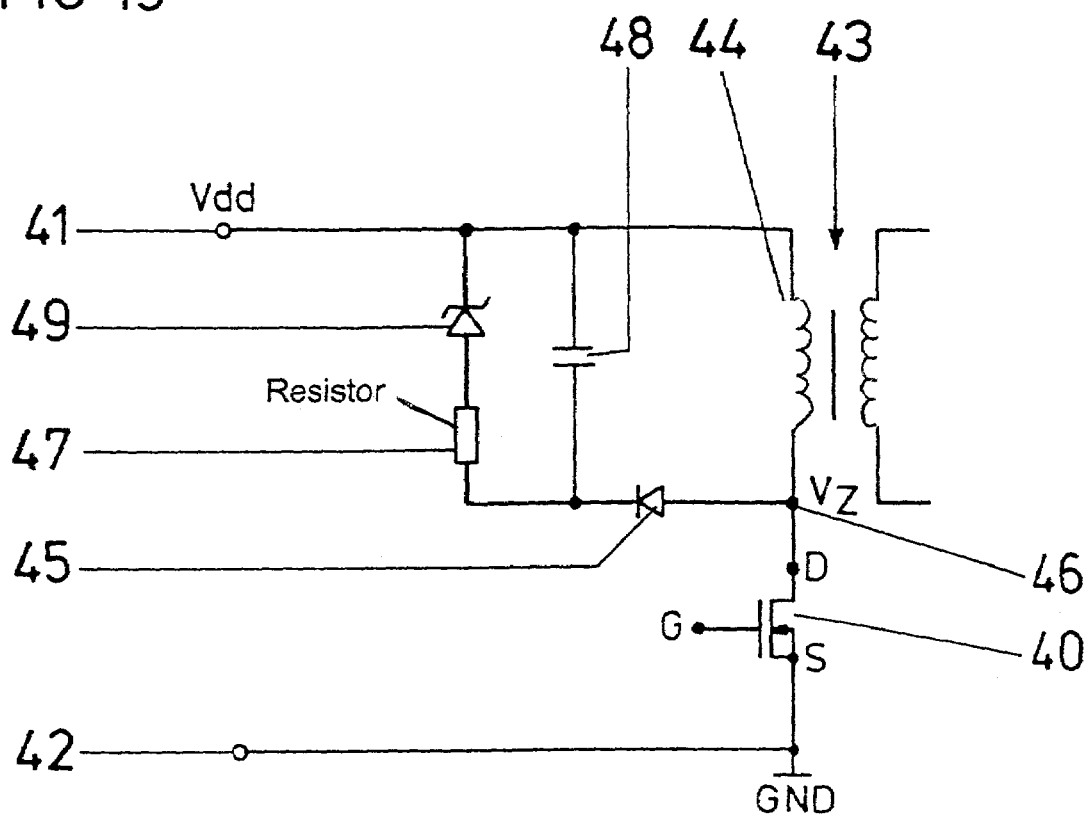
FIG. 15 shows the circuit diagram for an advantageous application of the inventive compensation component with a load-relieving network.

FIG. 15 shows the circuit diagram for an advantageous application of the inventive compensation component with a load-relieving network.

In FIG. 15, the reference numeral 40 designates the inventive compensation component. The compensation component 40 is arranged with its drain-source load path between a first terminal 41 with a first supply potential Vdd—for example a rectified, positive potential—and a second terminal 42 with a second supply potential GND—for example the reference ground potential. Furthermore, a transformer 43 is provided, whose primary-side winding 44 is connected in series with the load path of the compensation component 40 and between the terminals 41, 42.

The circuit furthermore has a so-called "RCD snubber". The RCD snubber includes, in a known manner, a diode 45. The anode of the diode 45 is connected to the center tap 46 between the compensation component 40 and the primary-side winding 44. The cathode of the diode 45 is connected in series with a parallel circuit formed by a resistor 47 and a capacitor 48. In contrast to known RCD snubber circuits, the circuit illustrated in FIG. 12 has an additional zener diode 49 arranged between the terminal 41 and the resistor 47.

The circuit illustrated in FIG. 15 may be, for example, part of a pulsed power supply, a voltage regulator, a voltage supply, a switched-mode power supply or the like, in the case of which, during the switch-off of the supply potential Vdd, for example 300 volts, it can happen that, depending on the turns ratio of the transformer 43, a kickback potential Vz builds up at the center tap 46. This kickback potential is significantly larger than the supply potential Vdd, and can be, for example 420 volts. The diode 45 is activated in this case because of the voltage difference ΔV=Vz−Vdd between the supply potential Vdd and the kickback potential Vz. In this case, the capacitor 48, which should have a very large capacitance, serves as a massive energy storage device for a disturbance situation. The dielectric strength of the newly added zener diode 49 should be designed such that the RCD snubber does not break down even in the event of a very large voltage difference ΔV. In the present example, a zener diode 49 designed for 150 V could be used. Instead of the zener diode, any other voltage-limiting element could also be used.

The RCD snubber modified with the additional zener diode 49 in accordance with FIG. 15 thus functions as a load-relieving network which takes effect only starting from a specific voltage difference ΔV.

The use of specially configured RCD snubbers is particularly advantageous for circuit arrangements that have to take up very large leakage energies due to leakage inductances. These RCD snubbers must be configured in such a way that their threshold voltage is chosen to be significantly above the reverse voltage designed for normal operation and above the maximum breakdown voltage of the transistor with incomplete ionization, but below the maximum achievable breakdown voltage of the inventive semiconductor component. Such an RCD snubber takes up hardly any energy during normal operation, and therefore, also does not appreciably impair the efficiency of the circuit topology. By virtue of the "voltage reserve" of the breakdown voltage, in the disturbance situation, i.e. in the event of a momentary excessively increased breakdown voltage, the RCD snubber is advantageously activated, and thus relieves the load on the actual semiconductor component.

In this way, a time- and voltage-controlled load-relieving element is thus provided for a semiconductor component. The advantage of the resultant semiconductor component is that on account of its low breakdown voltage in normal operation it reliably prevents the RCD snubber from taking up energy in an undesirable manner and the power loss caused by this from resulting in a reduction of the efficiency.

In addition to the circuit application mentioned, a multiplicity of further applications could, of course, be found for the inventive compensation component.

To summarize, it can be stated that by introducing an element with incomplete ionization into the compensation layer, and thus into the drift region of a compensation component, in a complete departure from known compensation components, it is possible to obtain, in a very simple but nevertheless very effective manner, a time dependence of the breakdown voltage of such a compensation component. In this way, the compensation component can be optimized with regard to different breakdown voltages.

The present invention has been set forth using the above description in such a way as to explain the principle of the invention and its practical application as well as possible. It goes without saying that the present invention can be realized in diverse embodiments and modifications in a suitable manner within the scope of expert action and knowledge.

We claim:

1. A semiconductor component, comprising:
   a semiconductor body having at least one compensation layer configured therein; and
   at least one depletion zone of a first conduction type and at least one complementary depletion zone of a second conduction type being opposite said first conduction type;
   said at least one depletion zone and said at least one complementary depletion zone being arranged alternately next to one another in said compensation layer;
   said compensation layer having a dopant and additionally having incompletely ionized dopants;
   said at least one depletion zone having a doping concentration of said first conduction type; and
   said incompletely ionized dopants being of said first conduction type and having a doping concentration in a range from 20 to 100% of said doping concentration of said at least one depletion zone.

2. The semiconductor component according to claim 1, wherein: said incompletely ionized dopants are distributed uniformly, as much as possible, within said compensation layer.

3. The semiconductor component according to claim 1, wherein:
   said at least one depletion zone defines a plurality of depletion zones; and
   a majority of said incompletely ionized dopants are distributed in said plurality of said depletion zones.

4. The semiconductor component according claim 1, wherein:
   said at least one depletion zone defines a plurality of complementary depletion zones;
   said incompletely ionized dopants are of said second conduction type; and
   a majority of said incompletely ionized dopants are distributed in said plurality of said complementary depletion zones.

5. The semiconductor component according to claim 1, wherein:
   said at least one depletion zone defines a plurality of depletion zones;
   said at least one complementary depletion zone defines a plurality of complementary depletion zones;
   said incompletely ionized dopants are all located exclusively within said plurality of said depletion zones.

6. The semiconductor component according to claim 1, wherein:
   said at least one depletion zone defines a plurality of depletion zones;
   said at least one complementary depletion zone defines a plurality of complementary depletion zones;
   said incompletely ionized dopants are all located exclusively within said plurality of said complementary depletion zones.

7. The semiconductor component according to claim 1, wherein:
   said at least one complementary depletion zone has a doping concentration of said second conduction type; and
   said incompletely ionized dopants are of said second conduction type and have a doping concentration in a range from 20 to 100% of said doping concentration of said at least one complementary depletion zone.

8. The semiconductor component according to claim 1, wherein:
said at least one complementary depletion zone has a doping concentration of said second conduction type; and
said incompletely ionized dopants are of said second conduction type and have a doping concentration that is greater than 50% of said doping concentration of said at least one complementary depletion zone.

9. The semiconductor component according to claim 1, wherein:
said doping concentration of said incompletely ionized dopants is greater than 50% of said doping concentration of said at least one depletion zone.

10. The semiconductor component according to claim 1, wherein: said incompletely ionized dopants are palladium.

11. The semiconductor component according to claim 1, wherein: said incompletely ionized dopants are selenium.

12. The semiconductor component according to claim 1, comprising:
a drain zone being adjoined by said compensation layer in a large-area manner.

13. The semiconductor component according to claim 12, comprising:
a drift zone of said first conduction type;
said drift zone being configured between said compensation layer and said drain zone;
said drift zone adjoining said compensation layer and said drain zone;
said at least one complementary depletion zone having a doping concentration;
said drift zone having a doping concentration that is lower than said doping concentration of said at least one depletion zone; and
said doping concentration of said drift zone being lower than said doping concentration of said at least one complementary depletion zone.

14. The semiconductor component according to claim 12, wherein:
said drain zone has charge carriers of said first conduction type; and
said semiconductor body, said at least one depletion zone, said at least one complementary depletion zone, said compensation layer, and said drain zone define a power MOSFET.

15. The semiconductor component according to claim 12, wherein:
said drain zone has charge carriers of said second conduction type; and
said semiconductor body, said at least one depletion zone, said at least one complementary depletion zone, said compensation layer, and said drain zone define an IGBT.

16. The semiconductor component according to claim 1, wherein:
said at least one depletion zone defines only a single depletion zone; and
said at least one complementary depletion zone defines a plurality of complementary depletion zones.

17. The semiconductor component according to claim 1, wherein:
said at least one complementary depletion zone defines only a single complementary depletion zone; and
said at least one depletion zone defines a plurality of depletion zones.

18. The semiconductor component according to claim 1, wherein:
said incompletely ionized dopants in said compensation layer have a degree of ionization that increases as a temperature of said incompletely ionized dopants is increased; and
said incompletely ionized dopants are only partly ionized when said temperature of said incompletely ionized dopants is room temperature.

19. The semiconductor component according to claim 1, comprising:
a plurality of individual transistors configured in cells of a cell array defining an active region, said plurality of said transistors having load paths connected in parallel;
a common driving configuration for controlling said plurality of said transistors;
said cell array containing a first region and remaining regions; and
said incompletely ionized elements being in said first region with a doping concentration that is higher than that in said remaining regions.

20. The semiconductor component according to claim 1, comprising:
an active region contributing to a current flow; and
an edge region causing field lines to be led in a defined manner from said semiconductor body in response to an applied voltage;
said incompletely ionized dopants having a doping concentration decreasing from said active region toward said edge region.

21. The semiconductor component according to claim 1, wherein: said semiconductor body is composed of a material selected from the group consisting of crystalline silicon and silicon carbide.

22. The semiconductor component according to claim 1, wherein:
said semiconductor body is formed to define a breakdown voltage and a degree of compensation; and
said semiconductor body is formed such that when a reverse voltage is applied, the degree of compensation changes as a function of time and the breakdown voltage increases in a manner governed by the degree of compensation.

23. A semiconductor component, comprising:
a semiconductor body having at least one compensation layer configured therein;
at least one depletion zone of a first conduction type and at least one complementary depletion zone of a second conduction type being opposite said first conduction type;
said at least one depletion zone and said at least one complementary depletion zone being arranged alternately next to one another in said compensation layer;
at least one body zone of said second conduction type, said body zone being embedded in said compensation layer; and
at least one source zone of said first conduction type, said source zone being embedded in said body zone;
said compensation layer having a dopant and additionally having incompletely ionized dopants;
said at least one depletion zone having a doping concentration of said first conduction type; and
said incompletely ionized dopants being of said first conduction type and having a doping concentration in a range from 20 to 100% of said doping concentration of said at least one depletion zone.

24. The semiconductor component according to claim 23, wherein: said incompletely ionized dopants are distributed uniformly, as much as possible, within said compensation layer.

25. The semiconductor component according to claim 23, wherein:
   said at least one depletion zone defines a plurality of depletion zones; and
   a majority of said incompletely ionized dopants are distributed in said plurality of said depletion zones.

26. The semiconductor component according claim 23, wherein:
   said at least one depletion zone defines a plurality of complementary depletion zones;
   said incompletely ionized dopants are of said second conduction type; and
   a majority of said incompletely ionized dopants are distributed in said plurality of said complementary depletion zones.

27. The semiconductor component according to claim 23, wherein:
   said at least one depletion zone defines a plurality of depletion zones;
   said at least one complementary depletion zone defines a plurality of complementary depletion zones;
   said incompletely ionized dopants are all located exclusively within said plurality of said depletion zones.

28. The semiconductor component according to claim 23, wherein:
   said at least one depletion zone defines a plurality of depletion zones;
   said at least one complementary depletion zone defines a plurality of complementary depletion zones;
   said incompletely ionized dopants are all located exclusively within said plurality of said complementary depletion zones.

29. The semiconductor component according to claim 23, wherein:
   said at least one complementary depletion zone has a doping concentration of said second conduction type p and
   said incompletely ionized dopants are of said second conduction type and have a doping concentration in a range from 20 to 100% of said doping concentration of said at least one complementary depletion zone.

30. The semiconductor component according to claim 23, wherein:
   said at least one complementary depletion zone has a doping concentration of said second conduction type; and
   said incompletely ionized dopants are of said second conduction type and have a doping concentration that is greater than 50% of said doping concentration of said at least one complementary depletion zone.

31. The semiconductor component according to claim 23, wherein:
   said doping concentration of said incompletely ionized dopants is greater than 50% of said doping concentration of said at least one depletion zone.

32. The semiconductor component according to claim 23, wherein: said incompletely ionized dopants are palladium.

33. The semiconductor component according to claim 23, wherein: said incompletely ionized dopants are selenium.

34. The semiconductor component according to claim 23, comprising:
   a drain zone being adjoined by said compensation layer in a large-area manner.

35. The semiconductor component according to claim 34, comprising:
   a drift zone of said first conduction type;
   said drift zone being configured between said compensation layer and said drain zone;
   said drift zone adjoining said compensation layer and said drain zone;
   said at least one complementary depletion zone having a doping concentration;
   said drift zone having a doping concentration that is lower than said doping concentration of said at least one depletion zone; and
   said doping concentration of said drift zone being lower than said doping concentration of said at least one complementary depletion zone.

36. The semiconductor component according to claim 34, wherein:
   said drain zone has charge carriers of said first conduction type; and
   said semiconductor body, said at least one depletion zone, said at least one complementary depletion zone, said at least one body zone, said at least one source zone, said compensation layer, and said drain zone define a power MOSFET.

37. The semiconductor component according to claim 34, wherein:
   said drain zone has charge carriers of said second conduction type; and
   said semiconductor body, said at least one depletion zone, said at least one complementary depletion zone, said at least one body zone, said at least one source zone, said compensation layer, and said drain zone define an IGBT.

38. The semiconductor component according to claim 23, wherein:
   said at least one depletion zone defines only a single depletion zone; and
   said at least one complementary depletion zone defines a plurality of complementary depletion zones.

39. The semiconductor component according to claim 23, wherein:
   said at least one complementary depletion zone defines only a single complementary depletion zone; and
   said at least one depletion zone defines a plurality of depletion zones.

40. The semiconductor component according to claim 23, wherein:
   said incompletely ionized dopants in said compensation layer have a degree of ionization that increases as a temperature of said incompletely ionized dopants is increased; and
   said incompletely ionized dopants are only partly ionized when said temperature of said incompletely ionized dopants is room temperature.

41. The semiconductor component according to claim 23, comprising:
   a plurality of individual transistors configured in cells of a cell array defining an active region, said plurality of said transistors having load paths connected in parallel;
   a common driving configuration for controlling said plurality of said transistors;
   said cell array containing a first region and remaining regions; and said incompletely ionized elements being in said first region with a doping concentration that is higher than that in said remaining regions.

42. The semiconductor component according to claim 23, comprising:

an active region contributing to a current flow; and an edge region causing field lines to be led in a defined manner from said semiconductor body in response to an applied voltage;

said incompletely ionized dopants having a doping concentration decreasing from said active region toward said edge region.

43. The semiconductor component according to claim 23, wherein: said semiconductor body is composed of a material selected from the group consisting of crystalline silicon and silicon carbide.

44. The semiconductor component according to claim 23, wherein:

said semiconductor body is formed to define a breakdown voltage and a degree of compensation; and said semiconductor body is formed such that when a reverse voltage is applied, the degree of compensation changes as a function of time and the breakdown voltage increases in a manner governed by the degree of compensation.

* * * * *